United States Patent
Ogo et al.

(10) Patent No.: US 11,932,096 B2
(45) Date of Patent: Mar. 19, 2024

(54) OVERHEAD TRAVELING VEHICLE SYSTEM

(71) Applicant: Murata Machinery, Ltd., Kyoto (JP)

(72) Inventors: Haruki Ogo, Inuyama (JP); Yasuhisa Ito, Ise (JP)

(73) Assignee: Murata Machinery, Ltd., Tokyo (JP)

( * ) Notice: Subject to any disclaimer, the term of this patent is extended or adjusted under 35 U.S.C. 154(b) by 705 days.

(21) Appl. No.: 17/265,784

(22) PCT Filed: May 27, 2019

(86) PCT No.: PCT/JP2019/020885
§ 371 (c)(1),
(2) Date: Feb. 3, 2021

(87) PCT Pub. No.: WO2020/031465
PCT Pub. Date: Feb. 13, 2020

(65) Prior Publication Data
US 2021/0162850 A1    Jun. 3, 2021

(30) Foreign Application Priority Data

Aug. 9, 2018   (JP) .................................. 2018-150670

(51) Int. Cl.
*B60K 1/04*         (2019.01)
*B61B 13/00*        (2006.01)

(52) U.S. Cl.
CPC ............... *B60K 1/04* (2013.01); *B61B 13/00* (2013.01); *B60K 2001/0494* (2013.01)

(58) Field of Classification Search
CPC .... H01L 21/67733; B60L 53/31; B60L 53/36; B60K 2001/0494; B60K 1/04; B61B 13/00
See application file for complete search history.

(56) References Cited

U.S. PATENT DOCUMENTS

| 4,273,053 A | 6/1981 | Gibbs |
| 8,628,289 B1 | 1/2014 | Benedict et al. |

(Continued)

FOREIGN PATENT DOCUMENTS

| CN | 103782246 A | 5/2014 |
| JP | H11-29288 A | 2/1999 |

(Continued)

OTHER PUBLICATIONS

Request for the Submission of an Opinion dated Jan. 16, 2023, of counterpart Korean Patent Application No. 10-2021-7002217, along with an English translation.

(Continued)

*Primary Examiner* — Scott A Browne
(74) *Attorney, Agent, or Firm* — DLA Piper LLP (US)

(57) ABSTRACT

An overhead traveling vehicle system having an overhead traveling vehicle includes a main body, at least an upper surface of which is of a rectangular shape as viewed in a plan view, and a traveling wheel provided in each of four corners on the upper surface of the main body and rolls on a traveling surface of a track, the main body being arranged below the track by connectors each extending downwardly from the traveling wheel, wherein the overhead traveling vehicle includes charging electrodes on the upper surface of the main body, and a charger is arranged in a space above the traveling surface, at least a part of which overlaps with a movement space for the traveling wheels as viewed in a side view, and does not overlap with the movement space as viewed in a plan view.

9 Claims, 12 Drawing Sheets

(56) References Cited

U.S. PATENT DOCUMENTS

| | | | |
|---|---|---|---|
| 9,352,658 B2 * | 5/2016 | Morris | B60L 53/11 |
| 10,434,889 B2 * | 10/2019 | Buehs | B60L 53/32 |
| 2007/0059131 A1 | 3/2007 | Yoshitaka | |
| 2011/0000015 A1 * | 1/2011 | Faucher | A61G 7/1042 |
| | | | 5/83.1 |
| 2014/0172196 A1 | 6/2014 | Hayashi et al. | |
| 2014/0207310 A1 * | 7/2014 | Cross | B60L 53/126 |
| | | | 701/2 |
| 2014/0217975 A1 * | 8/2014 | Hayashi | B60L 53/53 |
| | | | 320/109 |
| 2018/0320402 A1 * | 11/2018 | Evans | B60L 53/14 |
| 2019/0047786 A1 | 2/2019 | Suzuki | |
| 2019/0308820 A1 * | 10/2019 | Andreae | B65G 17/485 |

FOREIGN PATENT DOCUMENTS

| | | |
|---|---|---|
| JP | 2007-91463 A | 4/2007 |
| JP | 2007-204009 A | 8/2007 |
| JP | 2008-079373 A | 4/2008 |
| JP | 2011-109859 A | 6/2011 |
| JP | 2012-196093 A | 10/2012 |
| JP | 2013-091552 A | 5/2013 |
| JP | 5698497 B2 | 4/2015 |
| KR | 10-1454782 B1 | 10/2014 |
| WO | 2017/150006 A1 | 9/2017 |

OTHER PUBLICATIONS

First Office Action dated Feb. 21, 2023, of counterpart Chinese Patent Application No. 201980049194.5, along with a machine translation in English.

* cited by examiner

FIG.9
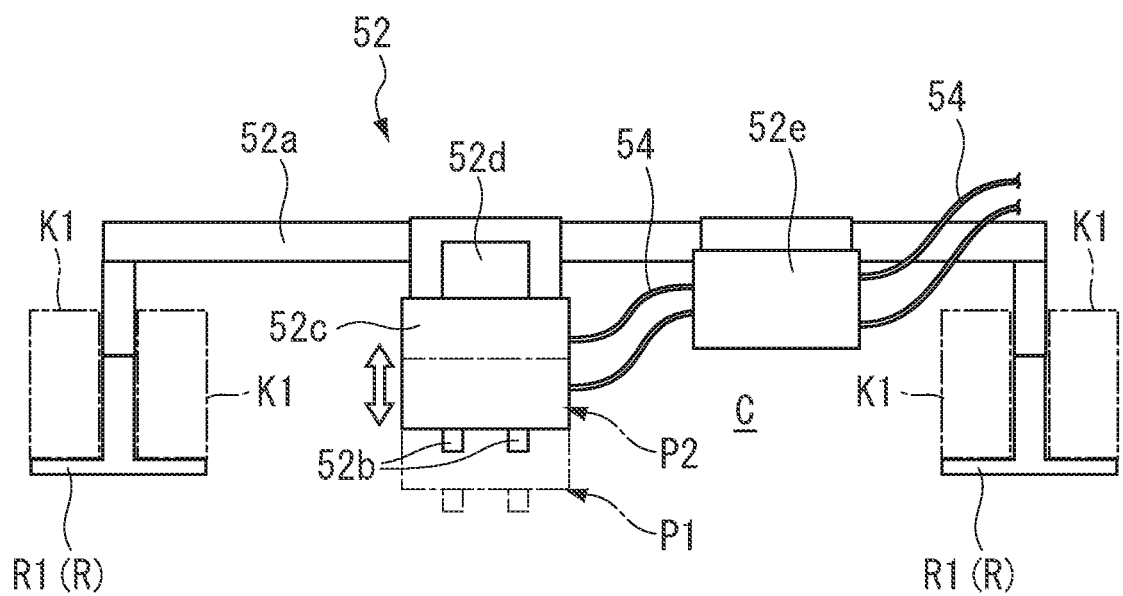
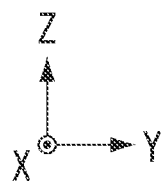

OVERHEAD TRAVELING VEHICLE SYSTEM

TECHNICAL FIELD

This disclosure relates to an overhead traveling vehicle system.

BACKGROUND

In semiconductor manufacturing factories, an overhead traveling vehicle system is used to transport articles such as FOUPs containing semiconductor wafers and reticle pods containing reticles. In such an overhead traveling vehicle system, it is proposed to mount on an overhead traveling vehicle a battery for traveling driving and to provide a charging facility that charges the battery while the overhead traveling vehicle, which travels on the track, is in a stop state (see Japanese Patent No. 5698497). In the overhead traveling vehicle system of JP '497, the battery is charged by lowering terminals of the charging facility arranged above charging electrodes that are arranged above the traveling wheels in the overhead traveling vehicle, and bringing the terminals into contact with the charging electrodes.

In the overhead traveling vehicle system of JP '497, the terminals of the charging facility are lowered and brought into contact with the charging electrodes above the traveling wheel and, therefore, the charging facility needs to be arranged above the track. Therefore, a space to arrange the charging facility is needed above the track, and the track needs to be arranged away (lowered) from the ceiling to allow the space. Since the overhead traveling vehicle has a main body suspended below the track from the traveling wheels, a movement space for the main body is required below the track. As a result, when the track is arranged away from the ceiling, the space for installing (the height dimension that allows installation of) various types of processing devices or storage devices is reduced within the building, creating a problem of the reduced efficiency of space utilization within the building.

It could therefore be helpful to provide an overhead traveling vehicle system capable of suppressing a reduction in the efficiency of space utilization within a building by enabling arrangement of the track for overhead traveling vehicles in the vicinity of the ceiling.

SUMMARY

Our overhead traveling vehicle system has an overhead traveling vehicle comprising a main body, at least an upper surface of which is of a rectangular shape as viewed in a plan view, and a traveling wheel which is provided in each of four corners on the upper surface of the main body and rolls on a traveling surface of a track, the main body being arranged below the track by connectors each extending downward from the traveling wheel, wherein the overhead traveling vehicle includes charging electrodes on the upper surface of the main body, and a charger is arranged in a space above the traveling surface, at least a part of which overlaps with a movement space for the traveling wheels as viewed in a side view, and does not overlap with the movement space as viewed in a plan view.

The track may include a first track provided along a first direction and a second track provided along a second direction intersecting with the first direction, the overhead traveling vehicle may be able to travel, moving from the first track to the second track, or from the second track to the first track, and the charger may be arranged at an intersection of the first track and the second track. The track may be a grid-patterned track in which a plurality of the first tracks and a plurality of the second tracks orthogonally intersect with each other and a plurality of cells are adjacent to each other as viewed in a plan view, the charger may include at least a power supply unit and a terminal unit, and the power supply unit and the terminal unit may be each arranged in a manner of being distributed to adjacent cells. The first tracks and the second tracks may be both provided along the same or substantially the same horizontal plane.

The terminal unit may be able to be raised or lowered between a connection position to be in contact with the charging electrodes and a waiting position to be away from the charging electrodes. The charger may include a control unit that controls the power supply unit and the terminal unit, and the control unit may be arranged in a cell different from the cells in which the power supply unit and the terminal unit are arranged. The power supply unit, the terminal unit, and the control unit may be electrically connected to each other by wiring, and the wiring may be arranged above the movement space. The overhead traveling vehicle may include a steerer that causes the traveling wheel to pivot around an axis in the vertical direction, and the charger may be arranged in a space that does not overlap with a pivoting space of the traveling wheel as viewed in a plan view. The charging electrodes may be arranged in a portion that does not overlap with a pivoting space of the steerer as viewed in a plan view.

The charger is arranged in a space, at least a part of which overlaps with the movement space for the traveling wheels as viewed in a side view, and does not overlap with the movement space for the traveling wheels as viewed in a plan view. Therefore, while preventing the traveling wheels from interfering with the charger, it is possible to suppress the space for arranging the charger above the track. As a result, the track can be arranged in the vicinity of the ceiling, and it is therefore possible to suppress a reduction in the efficiency of space utilization in the building.

In the configuration such that the track includes a first track provided along a first direction and a second track provided along a second direction intersecting with the first direction, the overhead traveling vehicle can travel, moving from the first track to the second track, or from the second track to the first track, and the charger is arranged at an intersection of the first track and the second track since the charger is arranged at the intersection, both the overhead traveling vehicle traveling on the first track and the overhead traveling vehicle traveling on the second track can easily access the charger. In the configuration such that the track is a grid-patterned track in which a plurality of the first tracks and a plurality of the second tracks orthogonally intersect with each other and a plurality of cells are adjacent to each other as viewed in a plan view, the charger includes at least a power supply unit and a terminal unit, the power supply unit and the terminal unit are each arranged in a manner of being distributed to adjacent cells, and the power supply unit and the terminal unit of the charger are arranged distributed in separate cells. As a result, the height-wise dimension of each unit can be reduced, and the space for arranging the units in the charger can be reduced in the vertical direction. In the configuration such that the first tracks and the second tracks are both provided along the same or substantially the same horizontal plane, both the first tracks and the second tracks can be arranged in the vicinity of the ceiling while also allowing the charger to be arranged.

In the configuration such that the terminal unit can be raised or lowered between a connection position to be in contact with the charging electrodes and a waiting position to be away from the charging electrodes, it is possible, by having the terminal unit at a waiting position when not charging, to prevent interference with the terminal unit when the overhead traveling vehicle is traveling. In the configuration such that the charger includes a control unit which controls the power supply unit and the terminal unit, and the control unit is arranged in a cell different from the cells in which the power supply unit and the terminal unit are arranged since the control unit is arranged in a separate cell, the height-wise dimension of each unit can be further reduced, and the space for arranging the control unit in the charger can be further reduced in the vertical direction. In the configuration such that the power supply unit, the terminal unit, and the control unit are electrically connected to each other by wiring, and the wiring is arranged above the movement space, it is possible to reliably prevent the traveling wheels from interfering with the wiring when the overhead traveling vehicle is traveling. In the configuration such that the overhead traveling vehicle includes a steerer that causes the traveling wheel to pivot around an axis in the vertical direction, and the charger is arranged in a space which does not overlap with a pivoting space of the traveling wheel as viewed in a plan view, it is possible to prevent the traveling wheel from interfering with the charger when the overhead traveling vehicle drives the steerer. In the configuration such that the charging electrodes are arranged in a portion which does not overlap with the pivoting space of the steerer as viewed in a plan view, it is possible to prevent the steerer from interfering with the charging electrodes when the steerer is driven.

BRIEF DESCRIPTION OF THE DRAWINGS

FIG. 9 is a diagram showing an example of a terminal unit.

DESCRIPTION OF REFERENCE SIGNS

Figure 1:
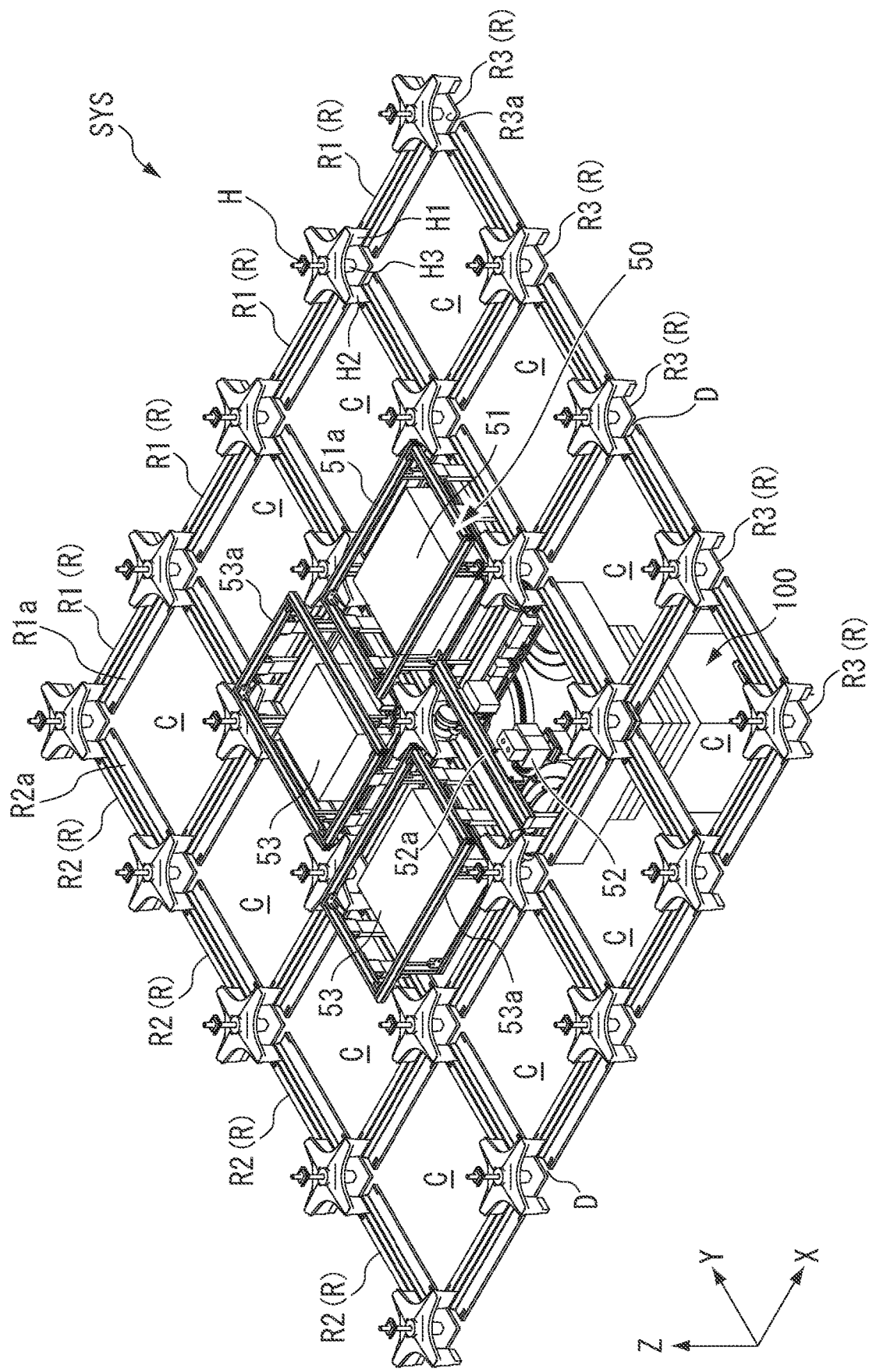
FIG. 1 is a perspective view showing an example of an overhead traveling vehicle system according to an example.

AX Pivot axis
C Cell
K1 Movement space
K2, K3 Pivoting space
M Article
P1 Connection position
P2 Waiting position
R Grid-patterned track (track)
R1 First track
R2 Second track
R3 Partial track
R1a, R2a, R3a Traveling surface
S1, S2, S3 Space
SYS Overhead traveling vehicle system
10 Main body
10a Upper surface
16 Battery
17 Charging electrode
20 Traveler
30 Coupler
34 Steerer
40 Controller
50 Charger
51 Power supply unit
52 Terminal unit
52b Terminal
53 Control unit
54 Wiring
100 Overhead traveling vehicle

DETAILED DESCRIPTION

The following describes an example of our systems with reference to the drawings. However, this disclosure is not limited to the example. In the drawings, scale is changed as necessary to illustrate the example such as by enlarging or emphasizing a part. In the following drawings, an XYZ coordinate system is used to describe the directions in each drawing. In this XYZ coordinate system, a plane parallel to the horizontal plane is defined as an XY plane. On this XY plane, one linear direction, which is the traveling direction of the overhead traveling vehicle 100, is referred to as the X direction, and the direction orthogonal to the X direction is referred to as the Y direction. The traveling direction of the overhead traveling vehicle 100 can change from the state shown in the following figure to another direction, and may also travel along, for example, a curved direction in some instances. The direction perpendicular to the XY plane is referred to as the Z direction. For each of the X direction, the Y direction, and the Z direction, description is made with a definition in which a direction indicated by an arrow is the positive (+) direction and a direction opposite to the direction indicated by the arrow is the negative (−) direction. The rotational direction about the Z axis is referred to as the θZ direction.

Figure 2:
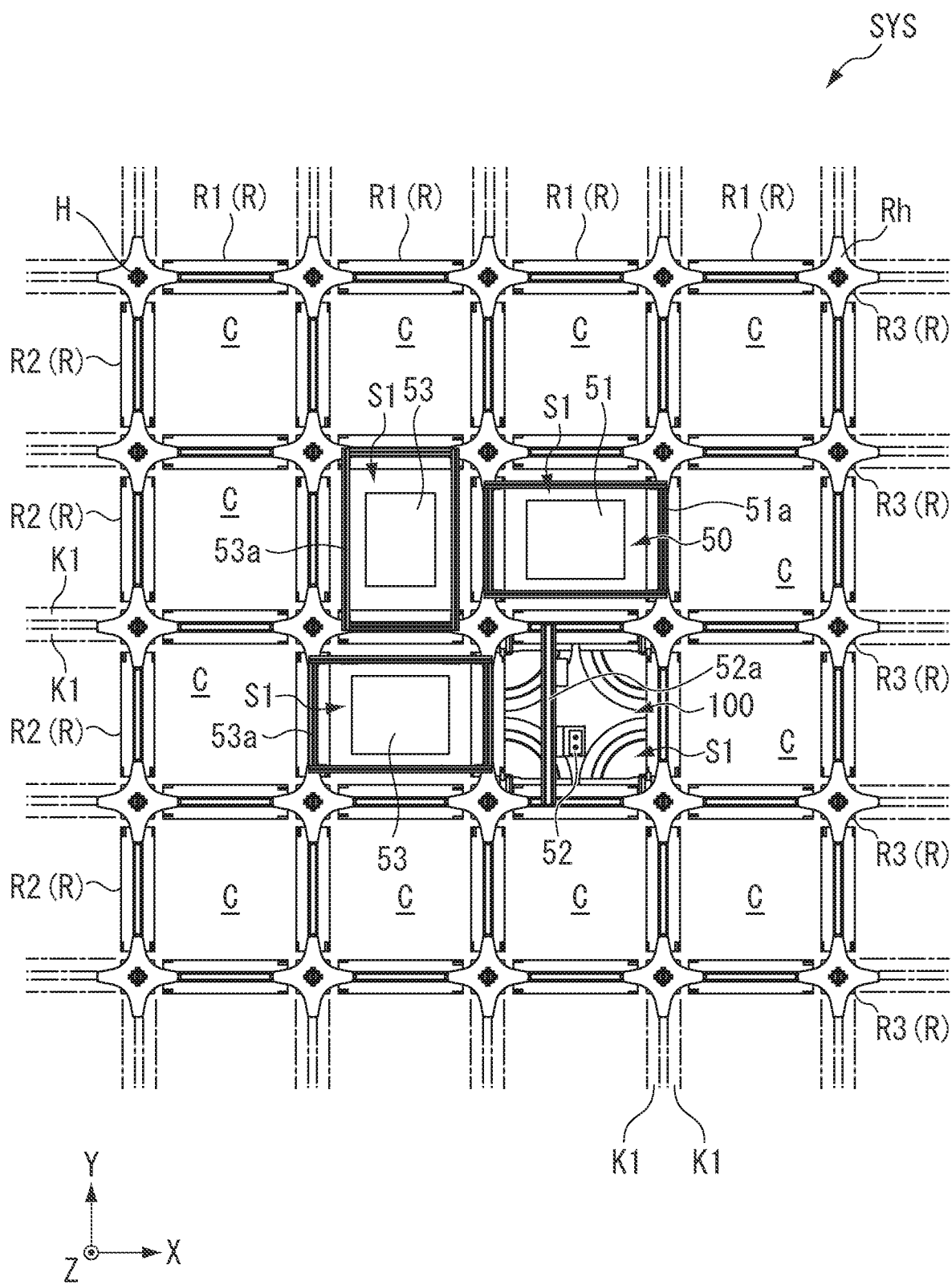
FIG. 2 is a plan view of the overhead traveling vehicle system shown in FIG. 1.
Figure 3:
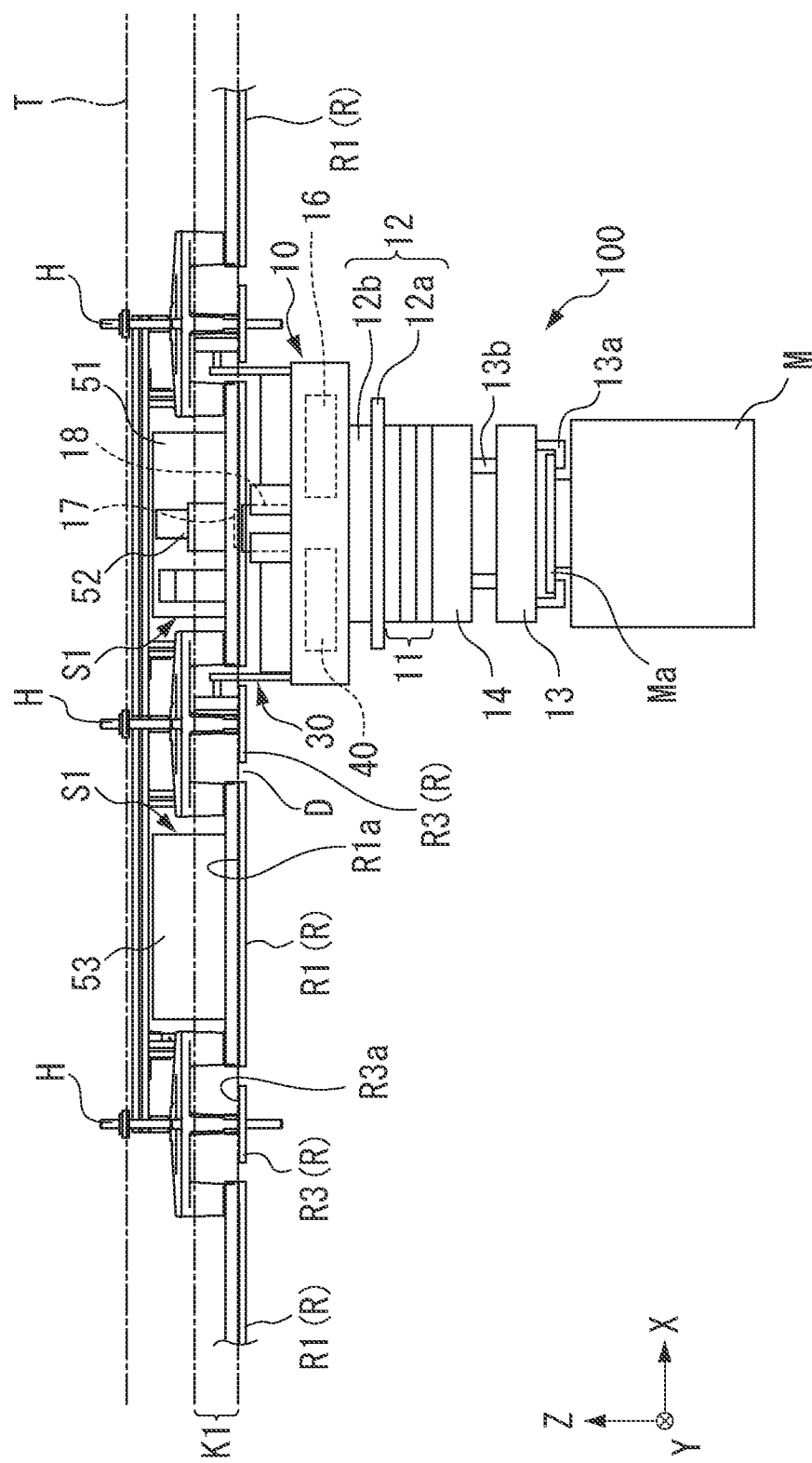
FIG. 3 is a side view of the overhead traveling vehicle system shown in FIG. 1.

FIG. 1 is a perspective view showing an example of an overhead traveling vehicle system SYS. FIG. 2 is a plan view of the overhead traveling vehicle system SYS shown in FIG. 1. FIG. 3 is a side view of the overhead traveling vehicle system SYS shown in FIG. 1. The overhead traveling vehicle system SYS shown in FIG. 1 to FIG. 3 is a system to transport articles M such as FOUPs containing semiconductor wafers and reticle pods containing reticles in a clean room of a semiconductor manufacturing factory, for example. The overhead traveling vehicle system SYS includes a grid-patterned track R, an overhead traveling vehicle 100, and a charger 50.

The grid-patterned track R is a form of track. The grid-patterned track R is installed in the vicinity of a ceiling T (see FIG. 3) of a clean room. The grid-patterned track R has first tracks R1, second tracks R2, and partial tracks R3. The grid-patterned track R is provided in a state of being suspended from the ceiling T via the suspenders H. Each suspender H has first portions H1 to suspend the first track R1, second portions H2 to suspend the second track R2, and a third portion H3 to suspend the partial track R3. The first portion H1 and the second portion H2 are each provided at two opposing locations with the third portion H3 therebetween.

A plurality of the first tracks R1 are provided along the X direction (the first direction). A plurality of the second tracks R2 are provided along the Y direction (the second direction). In this example, the first direction, along which the first tracks R1 are provided, and the second direction, along which the second tracks R2 are provided, orthogonally intersect with each other. The partial track R3 is arranged at a portion where the first track R1 and the second track R2 intersect with each other. Between the first track R1 and the partial track R3 and between the second track R2 and the partial track R3, there is provided a clearance D. In the grid-patterned track R, the first tracks R1 and the second tracks R2 orthogonally intersect with each other, thereby establishing a state where a plurality of cells C are adjacent to each other as viewed in a plan view. A single cell C is a region or a space surrounded by two first tracks R1 adjacent to each other in the Y direction and two second tracks R2 adjacent to each other in the X direction.

The first track R1, the second track R2, and the partial track R3 respectively have traveling surfaces R1a, R2a, and R3a on which the traveling wheels 21 described later of the overhead traveling vehicle 100 travel. The clearance D between the first track R1 and the partial track R3 and the clearance D between the second track R2 and the partial track R3 are portions over which couplers 30 (to be described later) serving as part of the overhead traveling vehicle 100 travel when the overhead traveling vehicle 100 having traveled on the first track R1 crosses the second track R2 or when the overhead traveling vehicle 100 having traveled on the second track R2 crosses the first track R1. Therefore, the clearance D is provided with a width that allows the coupler 30 to travel thereover. The first tracks R1, the second tracks R2, and the partial tracks R3 are provided along the same or substantially the same horizontal plane. The first tracks R1, the second tracks R2, and the partial tracks R3 are such that the traveling surfaces R1a, R2a, and R3a thereof are arranged on the same or substantially the same horizontal plane.

The charger 50 supplies electric power to a battery 16 of the overhead traveling vehicle 100, which will be described later. The charger 50 is arranged in a space S1 which is above the traveling surfaces R1a, R2a, and R3a of the grid-patterned track R, at least a part of which overlaps with a movement space K1 for the traveling wheels 21 of the overhead traveling vehicle 100 (to be described later) as viewed in a side view (FIG. 3), and does not overlap with the movement space K1 as viewed in a plan view (FIG. 2). The charger 50 includes a power supply unit 51, a terminal unit 52, and two control units 53.

The power supply unit 51 is supported by a frame 51a. The frame 51a is fixed to one or both of the first track R1 and the second track R2. However, the frame 51a is not limited to this configuration, and may be suspended from the ceiling T, for example. The terminal unit 52 is supported by a frame 52a. The frame 52a is fixed to the first track R1. However, the frame 52a is not limited to this configuration, and may be fixed to the second track R2 or suspended from the ceiling T. The control units 53 are supported by a frame 53a. The frame 51a is fixed to one or both of the first track R1 and the second track R2. However, the frame 51a is not limited to this configuration, and may be suspended from the ceiling T, for example. The details of the charger 50 will be described later.

Figure 4:
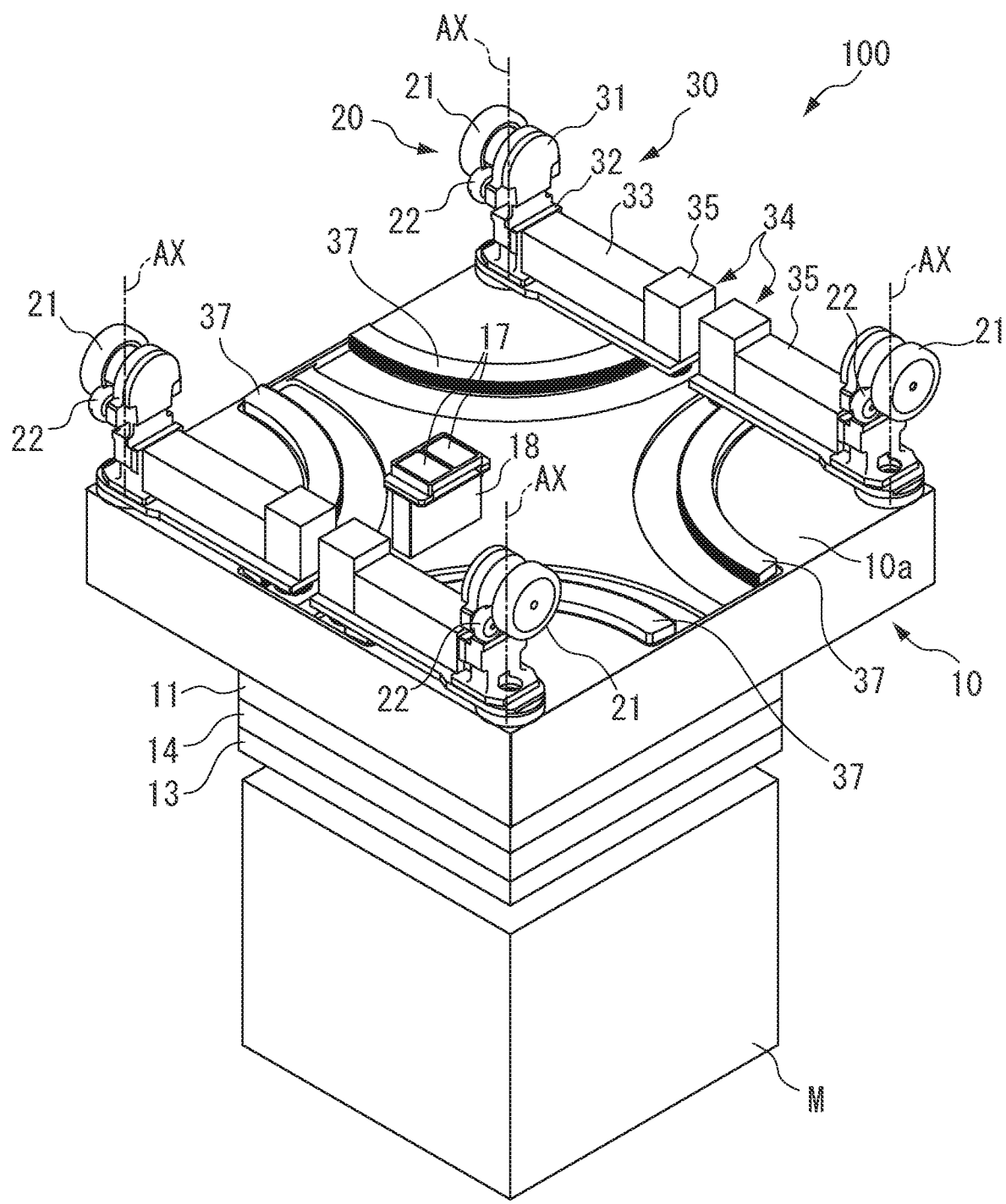
FIG. 4 is a perspective view showing an example of an overhead traveling vehicle.
Figure 5:
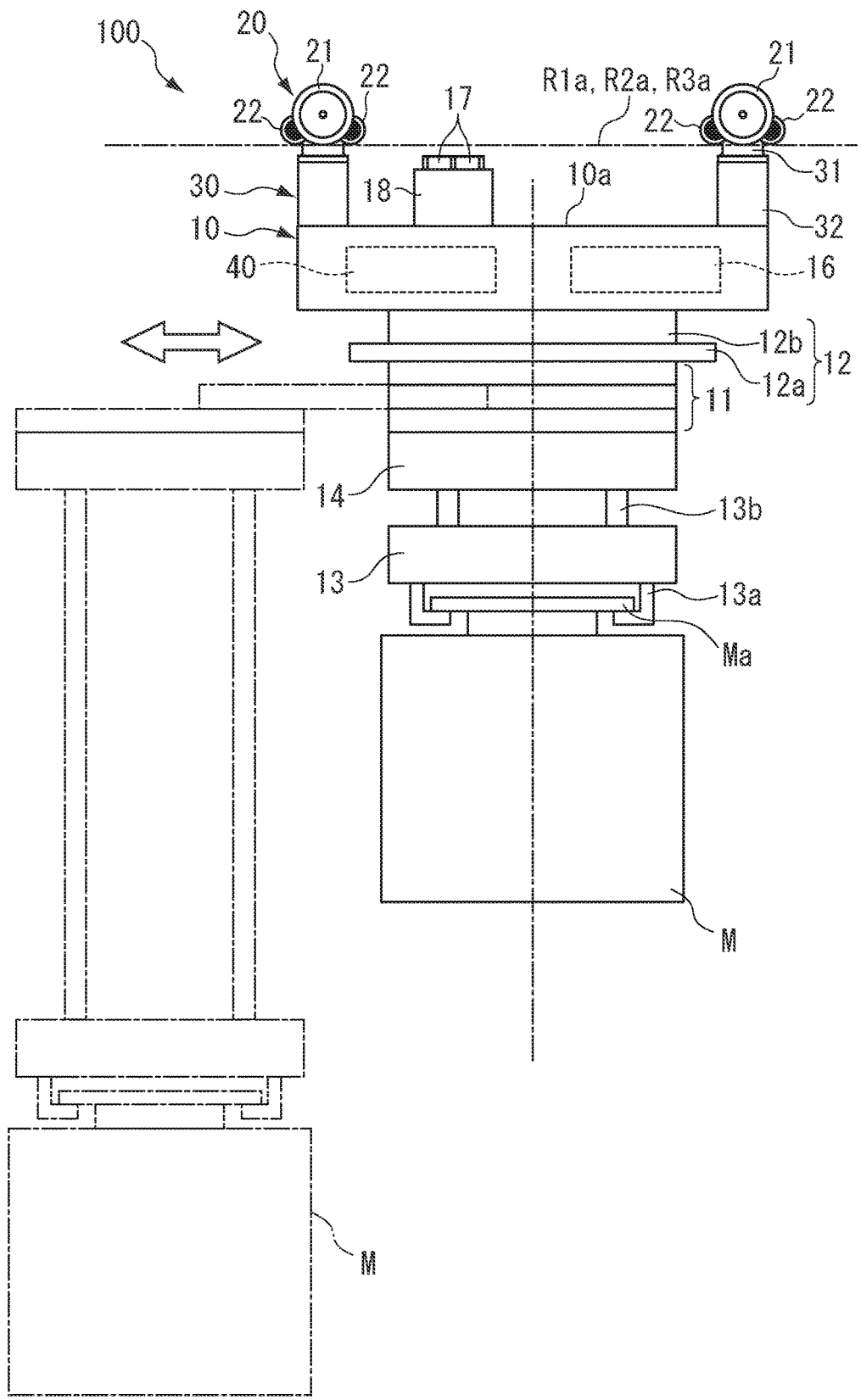
FIG. 5 is a front view of the overhead traveling vehicle shown in FIG. 4.

FIG. 4 is a perspective view showing an example of the overhead traveling vehicle 100. FIG. 5 is a front view of the overhead traveling vehicle 100 shown in FIG. 4. As shown in FIGS. 4 and 5, the overhead traveling vehicle 100 has a main body 10, travelers 20, couplers 30, and a controller 40. The overhead traveling vehicle 100 moves along the grid-patterned track R and transports articles M such as FOUPs and reticle pods. A plurality of the overhead traveling vehicles 100 may be used in the grid-patterned track R, or one overhead traveling vehicle 100 may be used. By transporting articles M by a plurality of the overhead traveling vehicles 100, it is possible to improve the efficiency of transporting articles M.

The main body 10 is arranged below the grid-patterned track R (on the −Z side). The main body 10 is formed, for example, in a rectangular shape as viewed in a plan view. Therefore, an upper surface 10a of the main body 10 has a rectangular shape and has four corners. The main body 10 is formed in a size that fits in a single cell C within the grid-patterned track R as viewed in a plan view. Therefore, the overhead traveling vehicles 100 traveling adjacent to each other on the grid-patterned track R do not interfere with one another.

The main body 10 has an article holder 13 to hold an article M, a lift driver 14 to raise or lower the article holder 13 in the vertical direction, and a lateral extender 11 to move the lift driver 14. The article holder 13 suspends and holds an article M by grasping a flange Ma provided on the upper part of the article M. The article holder 13 is, for example, a chuck having claws 13a movable in the horizontal direction, and it inserts the claws 13a under the flange Ma of an article M and raises the article holder 13 to thereby suspend and hold the article M. The article holder 13 is connected to the lower end of suspenders 13b such as wires and belts.

The lift driver 14 is, for example, a hoist, and lowers the article holder 13 by feeding out the suspenders 13b and lifts the article holder 13 by taking up the suspenders 13b. The lift driver 14 is controlled by the controller 40 to raise or lower the article holder 13 at a predetermined speed. Also, the lift driver 14 is controlled by the controller 40 to maintain the article holder 13 at a target height. The lateral extender 11 has a plurality of movable plates arranged in a stacked manner, for example, in the Z direction. The movable plates can move in the Y direction. The lift driver 14 is mounted on the lowermost movable plate. The lateral extender 11 can, by moving the movable plates by a driver not shown in the drawings, extend laterally with respect to the traveling direction the lift driver 14 attached to the lowermost movable plate and the article holder 13.

The rotator 12 has a rotation member 12a and a rotation driver 12b. The rotation member 12a is provided to be rotatable in an axial direction about the Z axis. The rotation member 12a supports the lateral extender 11. An electric motor or the like is used for the rotation driver 12b and causes the rotation member 12a to rotate in the axial direction about the Z direction axis. The rotator 12 can, by rotating the rotation member 12a by the driving force from the rotation driver 12b, rotate the lateral extender 11 (the lift driver 14 and the article holder 13) in the axial direction about the Z direction axis. In addition to the rotator 12 to control the direction of laterally extending the lift driver 14 and the article holder 13, a rotator to control the attitude of the lift driver 14 and the article holder 13 within the horizontal plane may be further provided between the lateral extender 11 and the lift driver 14.

The main body 10 includes a battery 16 and charging electrodes 17. The battery 16 is arranged inside the main body 10. The battery 16 stores electric power to be supplied to the travelers 20, the rotation driver 12b, the lift driver 14 and so forth of the overhead traveling vehicle 100. A secondary battery such as a lithium ion battery is used for the battery 16. The capacity of the battery 16 is determined on the basis of electric power used in the overhead traveling vehicle 100, operating time and so forth. The charging electrodes 17 are held by a holder 18 and are arranged on the upper surface 10a of the main body 10. The charging electrodes 17 are provided side by side at two locations on the upper surface side of the holder 18. One of the two charging electrodes 17 is electrically connected to the + side terminal of the battery 16. The other charging electrode 17 is electrically connected to the − side terminal of the battery 16. The battery 16 is supplied with electric power from the charger 50 via the charging electrodes 17.

Each traveler 20 has a traveling wheel 21 and auxiliary wheels 22. The traveling wheel 21 is arranged in each of the four corners on the upper surface 10a of the main body 10. Each traveling wheel 21 is rotatably supported on the coupler 30 by a rotation shaft not shown in the drawings. This rotation shaft is provided in parallel or substantially parallel along the XY plane (the horizontal plane). Therefore, the traveling wheel 21 can rotate about the axis line of the rotation shaft along the horizontal direction. Each traveling wheel 21 is driven to rotate by the driving force of a traveling driver 33, which will be described later. Each traveling wheel 21 rolls on the traveling surfaces R1a, R2a, and R3a of the first track R1, the second track R2, and the partial track R3 on the grid-patterned track R, causing the overhead traveling vehicle 100 to travel. The configuration is not limited to driving all of the four traveling wheels 21 to rotate by the drive force of the traveling driver 33, and only some of the four traveling wheels 21 may be driven to rotate.

As shown in FIG. 3, the movement space K1 for the traveling wheels 21 to move therein is formed on the traveling surfaces R1a, R2a, and R3a of the first track R1 and the second track R2. The height-wise (the Z direction) dimension of the movement space K1 is the same as or substantially the same as the outer diameter of the traveling wheel 21. Each traveling wheel 21 is provided to be able to pivot in the OZ direction about the pivot axis AX along the Z direction. The traveling wheel 21 can, by pivoting in the OZ direction, change the traveling direction thereof from the first direction to the second direction or from the second direction to the first direction.

The auxiliary wheels 22 are each arranged in front and rear of the traveling wheel 21 in the traveling direction. As with the traveling wheel 21, each auxiliary wheel 22 can rotate about the axis line of the rotation axis thereof parallel or substantially parallel along the XY plane. The lower end of the auxiliary wheel 22 is set higher than the lower end of the traveling wheel 21. Therefore, when the traveling wheel 21 is traveling on the traveling surfaces R1a, R2a, and R3a, the auxiliary wheel 22 does not come into contact with the traveling surfaces R1a, R2a, and R3. When the traveling wheel 21 passes over the clearance D, the auxiliary wheels 22 come into contact with the traveling surfaces R1a, R2a, and R3 to prevent the traveling wheel 21 from falling. The configuration is not limited to providing two of the auxiliary wheels 22 for a single traveling wheel 21 and, for example, a single auxiliary wheel 22 may be provided for a single traveling wheel 21, or no auxiliary wheel 22 may be provided.

The coupler 30 connects the main body 10 and the traveler 20. The coupler 30 is provided at each of the four corners on the upper surface 10a of the main body 10. The main body 10 is suspended by the couplers 30 and arranged below the grid-patterned track R. Each coupler 30 has a supporter 31 and a connector 32. The supporter 31 rotatably supports the rotation shaft of the traveling wheel 21 and the rotation shafts of the auxiliary wheels 22. The supporter 31 maintains the relative position between the traveling wheel 21 and the auxiliary wheels 22.

The connector 32 extends downward from each supporter 31 and is coupled to the upper surface 10a of the main body 10 to hold the main body 10. The connector 32 includes a transmission therein to transmit the driving force of the traveling driver 33 (to be described later) to the traveling wheel 21. This transmission may be of a configuration with use of a chain or a belt, or a configuration with use of a gear train. The connector 32 is provided to be rotatable in the OZ direction about the pivot axis AX. Rotation of the connector 32 about the pivot axis AX can cause the traveling wheel 21 to pivot in the OZ direction.

The traveling driver 33 and the steerer 34 are provided in the coupler 30. The traveling driver 33 is attached to the connector 32. The traveling driver 33 is a drive source to drive the traveling wheel 21 and, for example, an electric motor or the like is used therefor. Each of the four traveling wheels 21 is driven by the traveling driver 33 to serve as a driving wheel. The four traveling wheels 21 are controlled by the controller 40 to have the same or substantially the same rotation speed.

The steerer 34 causes the connector 32 of the coupler 30 to rotate about the pivot axis AX to thereby cause the traveling wheel 21 to pivot in the OZ direction. The traveling direction of the overhead traveling vehicle 100 can be changed from the first direction to the second direction or from the second direction to the first direction, by causing the traveling wheel 21 to pivot in the OZ direction.

The steerer 34 has a drive source 35, a pinion gear 36, and a rack (a toothed rail) 37. The drive source 35 is attached to a side surface of the traveling driver 33 away from the pivot axis AX. As the drive source 35, for example, an electric motor or the like is used. The pinion gear 36 is attached to the lower surface side of the drive source 35, and is driven to rotate in the OZ direction by the driving force generated by the drive source 35. The pinion gear 36 is of a circular shape as viewed in a plan view and has a plurality of teeth 36a on the outer circumference thereof along the circumferential direction (see FIG. 6). The rack 37 is fixed to the upper surface 10a of the main body 10. The rack 37 is provided at each of the four corners on the upper surface 10a of the main body 10, and is provided having an arc shape centered on the pivot axis AX of the traveling wheel 21. The rack 37 has a plurality of teeth 37a which mesh with the teeth 36a of the pinion gear 36 on the outer circumference thereof along the circumferential direction.

The pinion gear 36 and the rack 37 are arranged in the state where the plurality of teeth 36a and the plurality of teeth 37a are in mesh with each other. As the pinion gear 36 rotates in the OZ direction, the pinion gear 36 moves in the circumferential direction about the pivot axis AX along the outer circumference of the rack 37. This movement of the pinion gear 36 causes the traveling driver 33 and the steerer 34 to pivot together with the pinion gear 36 in the circumferential direction about the pivot axis AX.

Figure 6:
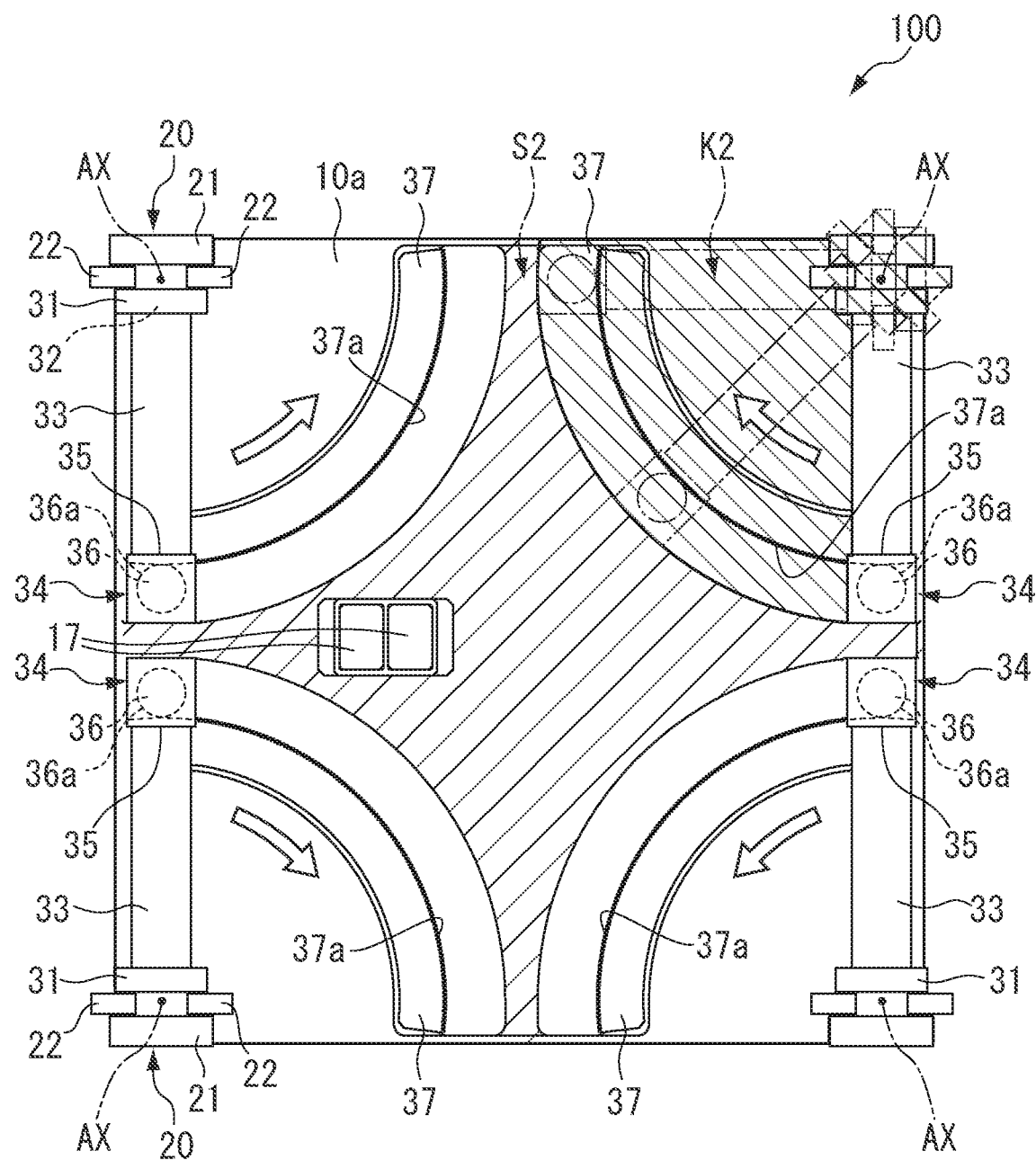
FIG. 6 is a plan view of the overhead traveling vehicle shown in FIG. 4.

FIG. 6 is a plan view showing an example of the upper surface side of the main body 10. As shown in FIG. 6, the steerer 34 pivots in a pivoting space K2 centered on the pivot axis AX as viewed in a plan view. Although the pivoting space K2 of the top-right steerer 34 is shown with a hatched pattern as an example in FIG. 6, the pivoting space K2 is formed at each of the four corners. As shown in FIG. 6, a space S2 not overlapping with the pivoting space K2 as viewed in a plan view is present on the upper surface 10a of the main body 10. When the steerers 34 pivot, this space S2 is a space which does not interfere with the steerers 34 pivoting. As shown in FIG. 6, the charging electrodes 17 are arranged in the space S2. This configuration can prevent the charging electrodes 17 from interfering with the steerers 34 even when the steerers 34 are pivoting.

As the steerers 34 pivot, the traveling wheel 21 and the auxiliary wheels 22 arranged in each of the four corners on the upper surface 10a all pivot in the OZ direction about the pivot axis AX within the range of 90 degrees. The driving of the steerers 34 is controlled by the controller 40. The controller 40 may instruct the four traveling wheels 21 to perform the pivoting operation at the same timing, or may instruct them to perform the pivoting operations at different timings. By causing the traveling wheel 21 and the auxiliary wheels 22 to pivot, the traveling wheel 21 shifts from the state of being in contact with one of the first track R1 and the second track R2 to the state of being in contact with the other. As a result, the traveling direction of the overhead traveling vehicle 100 can be switched between the first direction (the X direction) and the second direction (the Y direction).

Figure 7:
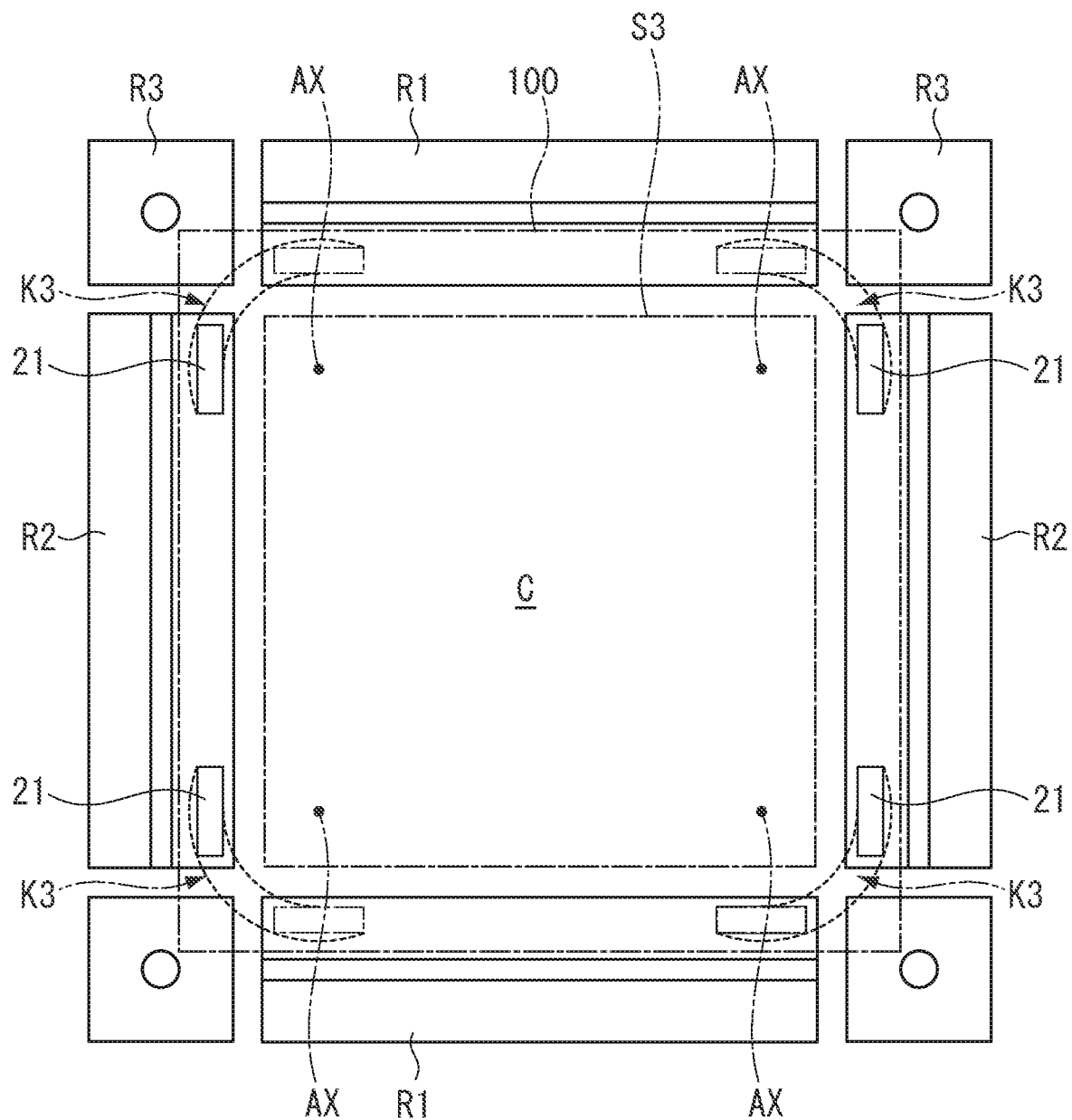
FIG. 7 is a plan view showing the overhead traveling vehicle in one cell of a grid-patterned track.

FIG. 7 is a plan view of one of the cells C of the grid-patterned track R. As shown in FIG. 7, as the steerer 34 pivots, the traveling wheel 21 pivots within the range of a pivoting space K3 centered on the pivot axis AX. The pivoting space K3 is formed in a range of 90 degrees in the OZ direction from the first track R1 to the second track R2. As shown in FIG. 7, a space S3 not overlapping with the pivoting space K3 as viewed in a plan view is present in the cell C. When the traveling wheel 21 pivots, this space S3 is a space which does not interfere with the traveling wheel 21 pivoting. The space S3 is formed within the space S1 shown in FIGS. 2 and 3.

Electric power is supplied to the traveling drivers 33 and the steerers 34 from the battery 16 of the main body 10. The controller 40 controls the operations of the traveling drivers 33 and the steerers 34. The controller 40 controls the four traveling drivers 33 to set the speed, stop position, and so forth of the overhead traveling vehicle 100, and controls the steerer 34 to shift from the first track R1 to the second track R2, or from the second track R2 to the first track R1. The controller 40 is provided in a part of the main body 10, however, is not limited to this form. The controller 40 may be provided outside the main body 10, for example. Electric power for the controller 40 is supplied from the battery 16.

As shown in FIGS. 2 and 3, the power supply unit 51, the terminal unit 52, and the control units 53 of the charger 50 are arranged in the space S1 at least a part of which overlaps with the movement space K1 of the traveling wheels 21 as viewed in a side view, and does not overlap with the movement space K1 as viewed in the plan view. The charger 50 is arranged at the intersection of the first tracks R1 and the second tracks R2. As a result, both an overhead traveling vehicle 100 traveling on the first tracks R1 and an overhead traveling vehicle 100 traveling on the second tracks R2 can easily access the charger 50. In the grid-patterned track R of this example, the overhead traveling vehicle 100 can enter each cell C from both the first tracks R1 and the second tracks R2. Therefore, in this grid-patterned track R, each cell C serves as an intersection.

The power supply unit 51, the terminal unit 52, and the control units 53 are arranged distributed in different cells C. By distributing and arranging each unit in a separate cell C, the height-wise dimension of each unit can be reduced, and the space for arranging the units in the charger 50 can be reduced in the vertical direction. The power supply unit 51 and the terminal unit 52 are arranged distributed in adjacent cells C. This configuration enables a reduction in the length of wirings connecting the power supply unit 51 and the terminal unit 52.

As shown in FIG. 7, the power supply unit 51, the terminal unit 52, and the control units 53 are arranged to fit in the space S3. This configuration can prevent the traveling wheels 21 from interfering with the power supply unit 51 and so forth when the traveling wheels 21 pivot although a part of the charger 50 partially overlaps with the movement space K1 of the traveling wheels 21 as viewed in a side view.

The power supply unit 51 is connected to an external alternating current power source by wiring or the like, and makes adjustments such as conversion from alternating current to direct current and voltage setting, necessary for charging the battery 16. A single power supply unit 51 is used in this example, however, our systems are not limited to this configuration and two or more power supply units may be used. When a plurality of power supply units 51 are used, each power supply unit 51 may be arranged in a different cell C. The control units 53 control the operations of the power supply unit 51 and the terminal unit 52 described later. In this example, two control units 53 are used, however, the number of control units 53 may be one, or three or more. These units are electrically connected by wiring.

Figure 8:
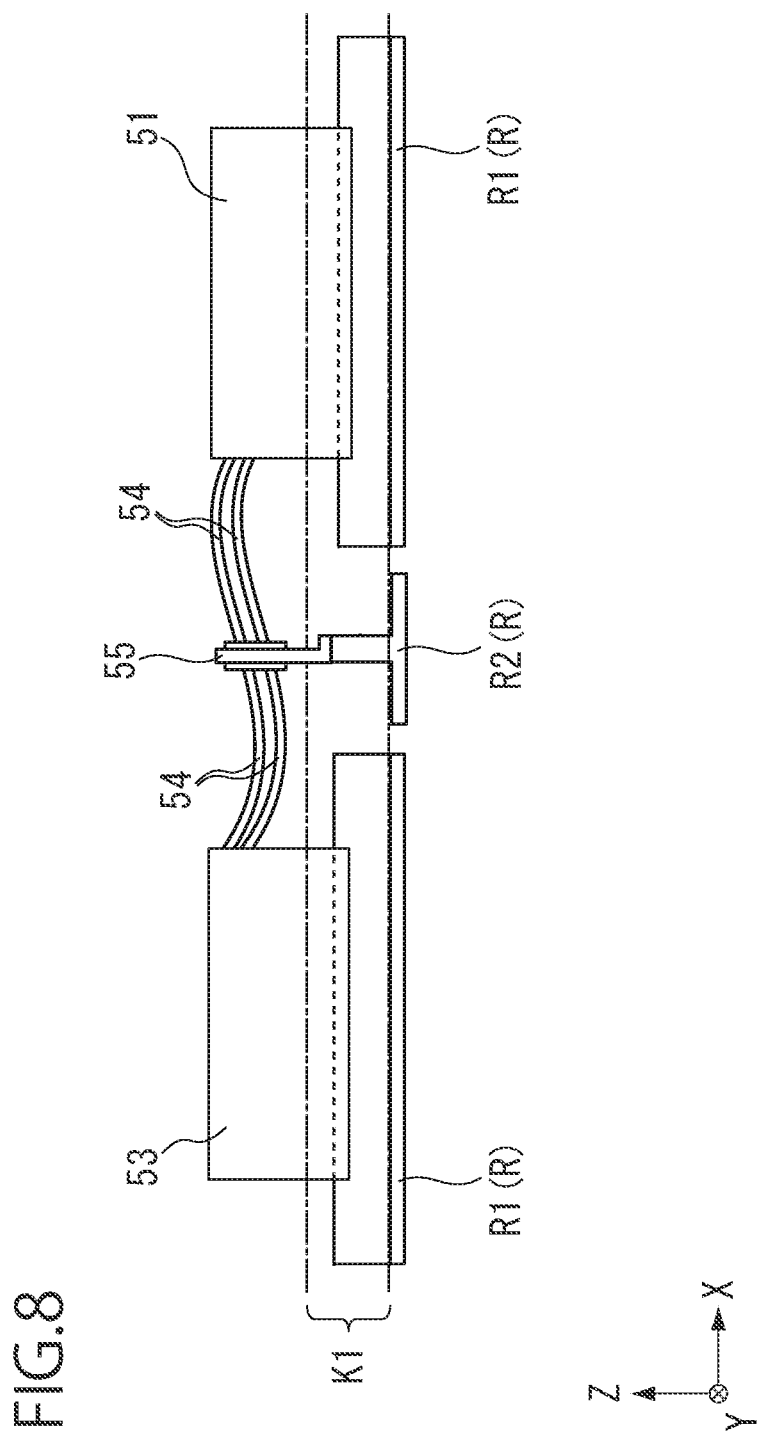
FIG. 8 is a diagram showing an example of a connection configuration between units in a charger.

FIG. 8 is a diagram showing an example of a connection configuration between the units in the charger 50. As shown in FIG. 8, the power supply unit 51 and the control unit 53 are electrically connected by wirings 54. The wiring 54 need to be arranged to cross the first track R1 or the second track R2. For this reason, as shown in FIG. 8, a part of the wiring 54 is held by a stay 55 attached to a center rib (the portion extending upward from the traveling surface) of the second track R2 (or the first track R1). As a result, the wiring 54 is arranged above the movement space K1 of the overhead traveling vehicle 100. This configuration can prevent the traveling wheels 21 from interfering with the wiring 54 when the overhead traveling vehicle 100 is traveling.

The power supply unit 51 and the terminal unit 52 are also electrically connected by wiring 54. This wiring 54 also crosses the first track R1 or the second track R2 as with the wiring 54 between the power supply unit 51 and the control unit 53 and, therefore, this wiring 54 is arranged above the movement space K1 using a stay 55 shown in FIG. 8.

FIG. 9 is a diagram showing an example of the terminal unit 52. The terminal unit 52 comes in contact with the charging electrodes 17 of the overhead traveling vehicle 100 to electrically connect to the charging electrodes 17, and supplies electric power from the power supply unit 51 to the battery 16 via the charging electrodes 17. As shown in FIG. 9, the terminal unit 52 includes terminals 52b that come into contact with the charging electrodes 17, a holder 52c that holds the terminals 52b, an elevator 52d that raises or lowers the holder 52c in the Z direction, and a supporting part 52e that supports the wiring 54 between the terminals 52b and the power supply unit 51.

The terminals 52b are arranged oriented downward (in the −Z direction). Two terminals 52b are provided side by side to align with the two charging electrodes 17, and are arranged at the same pitch as the two charging electrodes 17. The holder 52c holds the upper parts of the terminals 52b while exposing the lower parts of the terminals 52b. The elevator 52d is provided on the frame 52a and has a drive source such as an electric motor not shown in the drawings, and raises or lowers the holder 52c by the driving force of the drive source. The elevator 52d can raise or lower the holder 52c between a connection position P1 at which the terminals 52b contact the charging electrodes 17 and a waiting position P2 at which the terminals 52b are away from the charging electrodes 17. This configuration can prevent interference between the charging electrodes 17 and the terminals 52b when the overhead traveling vehicle 100 is traveling as the terminals 52b (the holder 52c) retreat to the waiting position P2 when charging is not performed.

The supporting part 52e is attached to the frame 52a and supports a part of the wiring 54. When the wiring 54 is of a length required for raising and lowering the holder 52c, the wiring 54 may sag down in the cell C in some situations. With the supporting part 52e having a part of the wiring 54 at a height near the frame 52a, it is possible to prevent interference between a part of the overhead traveling vehicle 100 and the wiring 54 when the overhead traveling vehicle 100 is traveling.

Figure 10A:
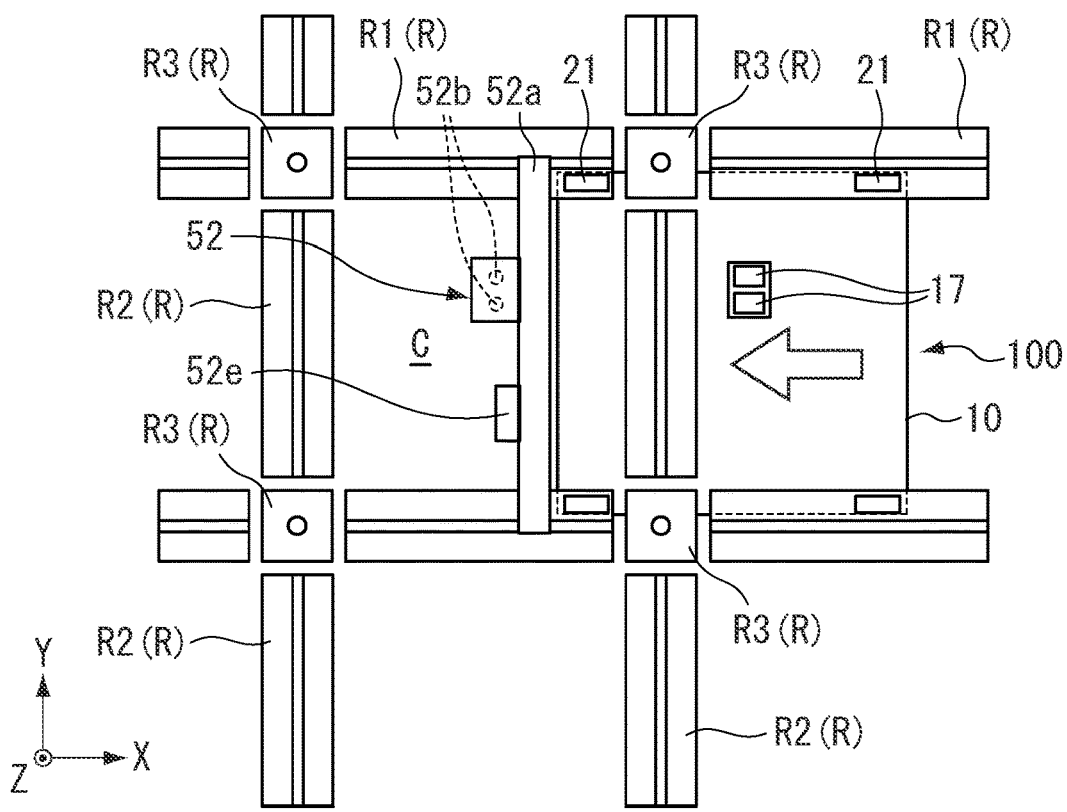
FIG. 10 shows an example of when the overhead traveling vehicle travels along first tracks, FIG. 10(A) being a diagram of the overhead traveling vehicle in a state of traveling toward the terminal unit, and FIG. 10(B) being a diagram of the overhead traveling vehicle in a state of having reached below the terminal unit.
Figure 10B:
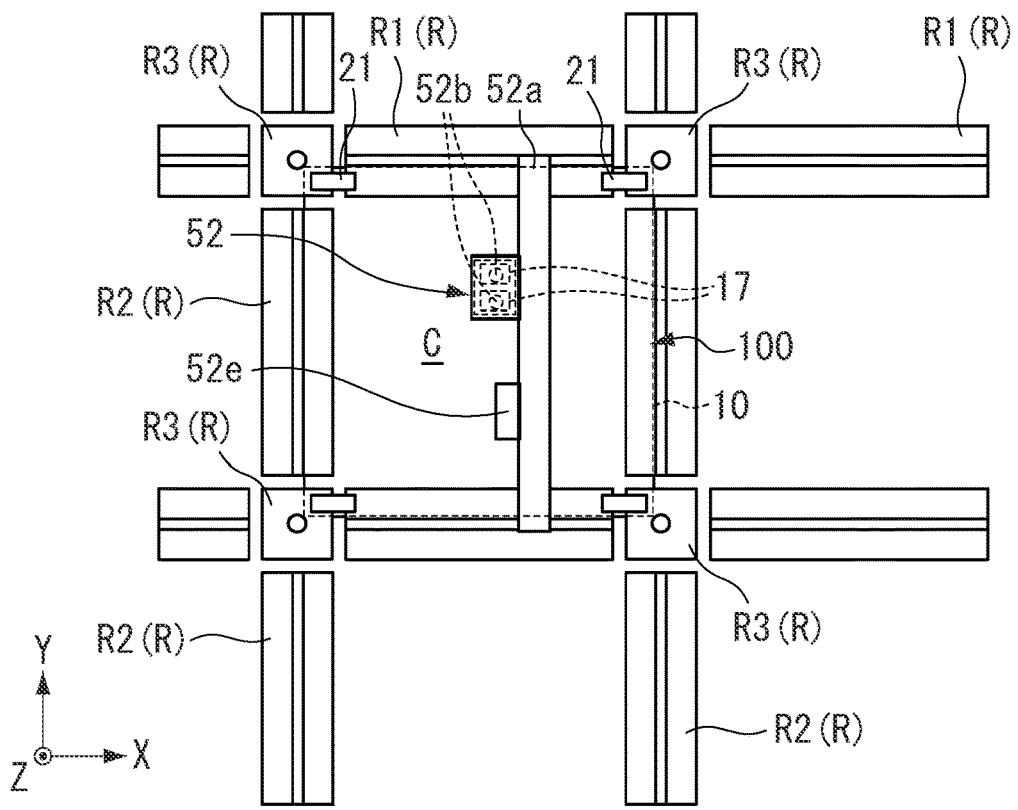

Next, here are described operations performed when the overhead traveling vehicle 100 performs charging by the charger 50 in the overhead traveling vehicle system SYS. FIG. 10 shows an example of when the overhead traveling vehicle 100 travels along the first tracks R1, FIG. 10(A) being a diagram showing the overhead traveling vehicle 100 in a state of traveling toward the terminal unit 52, and FIG. 10(B) being a diagram showing the overhead traveling vehicle 100 in a state of having reached below the terminal unit 52. The overhead traveling vehicle 100 acquires, from a host controller or the like not shown in the drawings, position information of the cell C where the charger 50 is located. As shown in FIG. 10(A), the overhead traveling vehicle 100 is traveling on the first tracks R1 in the −X direction toward the cell C where the terminal unit 52 is located.

As shown in FIG. 10(B), when the overhead traveling vehicle 100 reaches the cell C where the terminal unit 52 is arranged, the charging electrodes 17 of the overhead traveling vehicle 100 overlap with the terminals 52b of the terminal unit 52 as viewed in a plan view. The charging electrodes 17 and the terminal unit 52 are preliminarily positioned to oppose to each other when the overhead traveling vehicle 100 reaches the cell C. An example is described as an example in FIG. 10 where the overhead traveling vehicle 100 is traveling on the first tracks R1 in the −X direction. However, similarly, also when the overhead traveling vehicle 100 travels on the first tracks R1 in the +X direction, the charging electrodes 17 and the terminal unit 52 oppose to each other as shown in FIG. 10(B).

Figure 11A:
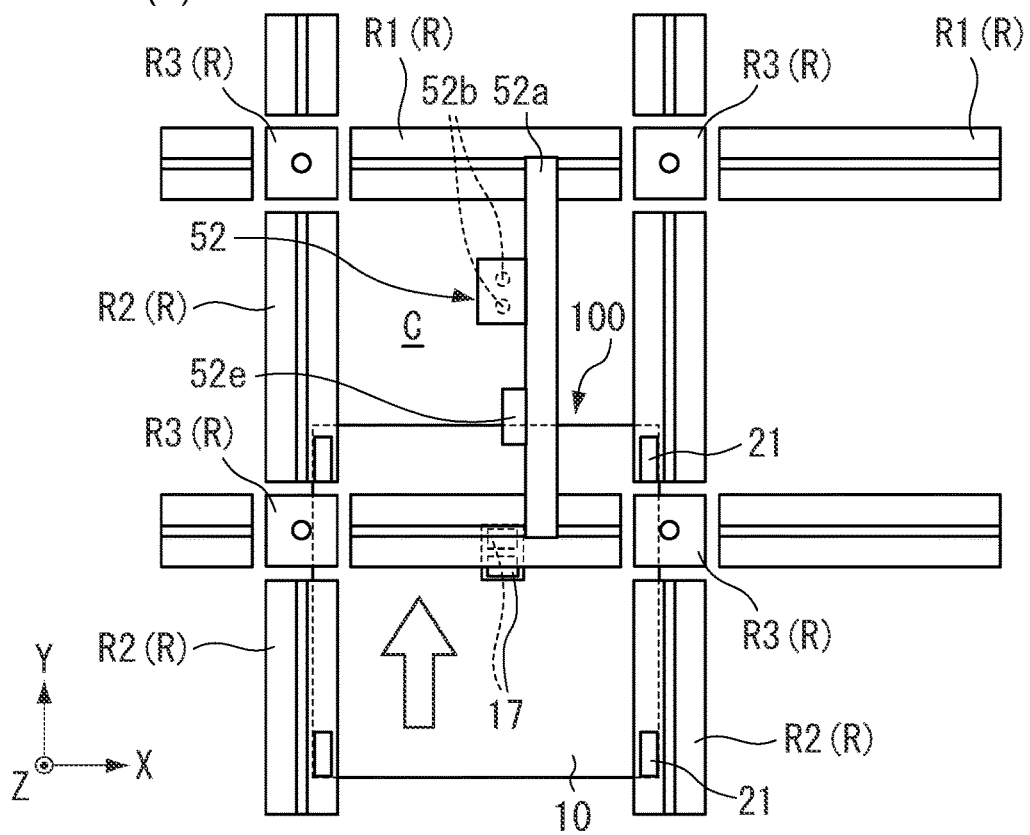
FIG. 11 shows an example of when the overhead traveling vehicle travels along second tracks, FIG. 11(A) being a diagram of the overhead traveling vehicle in a state of traveling toward the terminal unit, and FIG. 11(B) being a diagram of the overhead traveling vehicle in a state of having reached below the terminal unit.
Figure 11B:
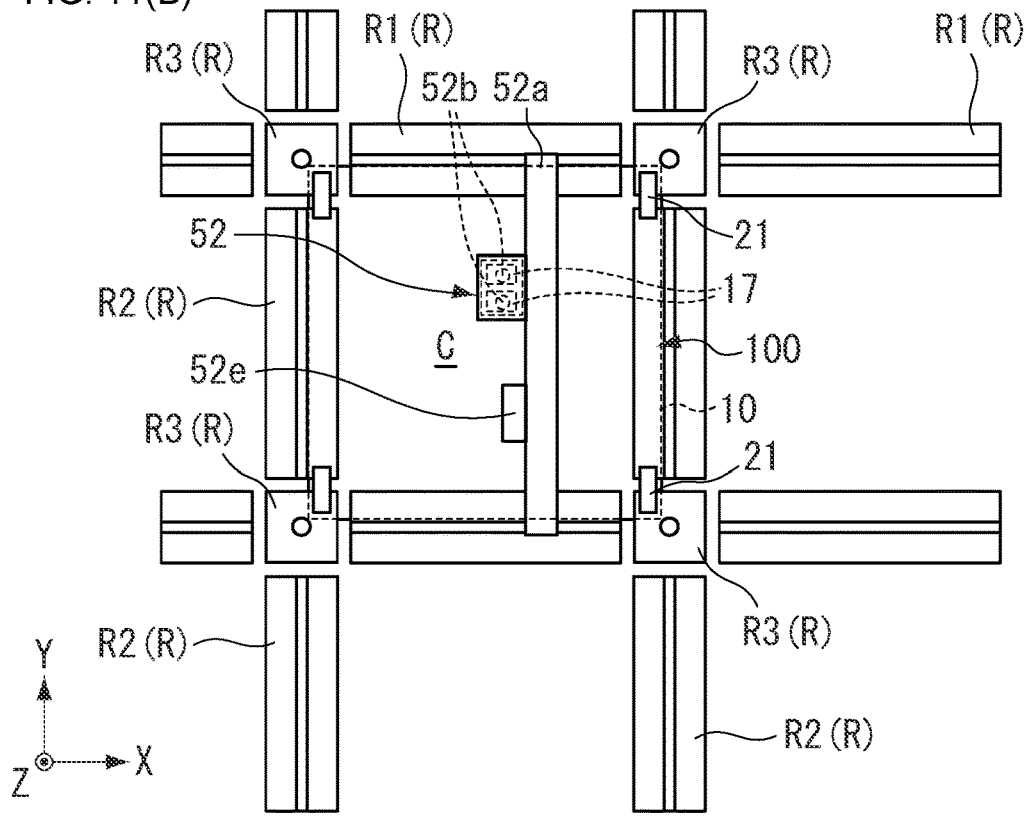

FIG. 11 shows an example of when the overhead traveling vehicle 100 travels along the second tracks R2, FIG. 11(A) being a diagram showing the overhead traveling vehicle 100 in a state of traveling toward the terminal unit 52, and FIG. 11(B) being a diagram showing the overhead traveling vehicle 100 in a state of having reached below the terminal unit 52. As shown in FIG. 11(A), the overhead traveling vehicle 100 is traveling on the second tracks R2 in the +Y direction toward the cell C where the terminal unit 52 is located.

As shown in FIG. 11(B), when the overhead traveling vehicle 100 reaches the cell C where the terminal unit 52 is arranged, the charging electrodes 17 of the overhead traveling vehicle 100 overlap with the terminals 52b of the terminal unit 52 as viewed in a plan view. An example is described as an example in FIG. 11 where the overhead traveling vehicle 100 is traveling on the second track R2 in the +Y direction. However, similarly, also when the overhead traveling vehicle 100 travels on the second tracks R2 in the −Y direction, the charging electrodes 17 and the terminal unit 52 oppose to each other as shown in FIG. 11(B).

As shown in FIGS. 10 and 11, the charging electrodes 17 and the terminal unit 52 can be brought into the state of opposing to each other in the cell C regardless of whether the overhead traveling vehicle 100 is traveling on the first tracks R1 or is traveling on the second tracks R2. The overhead traveling vehicle 100 only causes the traveling wheels 21 to pivot and does not cause the main body 10 to rotate when shifting from the first track R1 to the second track R2 or from the second track R2 to the first track R1. Therefore, if the positioning between the charging electrodes 17 and the terminal unit 52 is determined preliminarily, the charging electrodes 17 and the terminal unit 52 are brought to the state of opposing to each other when the overhead traveling vehicle 100 reaches the cell C regardless of whether the overhead traveling vehicle 100 travels on the first tracks R1 or travels on the second tracks R2.

Information indicating that the overhead traveling vehicle 100 has reached the cell C can be acquired by position information transmitted from the overhead traveling vehicle 100 to the host controller. The control unit 53 of the charger 50 receives from the host controller information indicating that the overhead traveling vehicle 100 has reached the cell C, and causes the terminal unit 52 to operate on the basis of this information. The control unit 53 is not limited to acquiring from the host controller information indicating that the overhead traveling vehicle 100 has reached the cell C, and may acquire the information by receiving a signal by wireless communication or the like from the overhead traveling vehicle 100 which has reached the cell C. A sensor or the like may be arranged in the cell C, and information indicating that the overhead traveling vehicle 100 has reached the cell C may be acquired from the result of detection performed by the sensor.

Figure 12A:
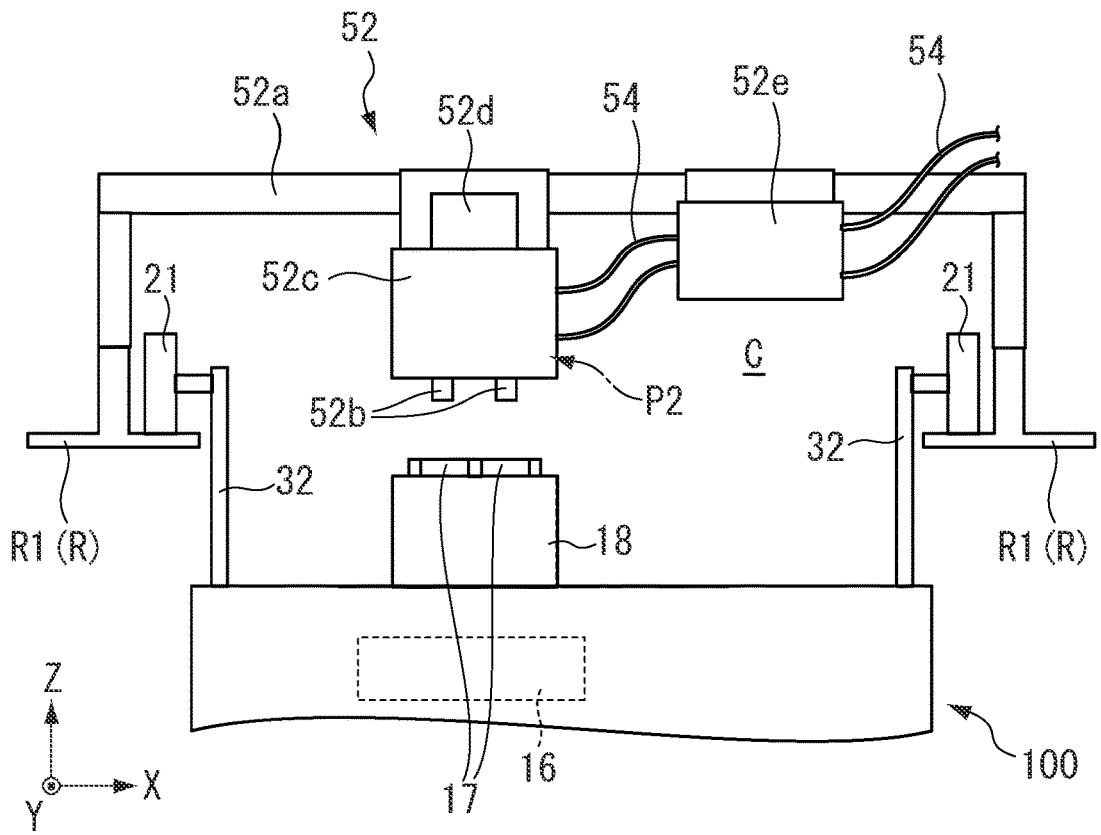
FIG. 12 shows an example of an operation of the terminal unit, FIG. 12(A) being a diagram of terminals of the terminal unit in a state of having separated from charging electrodes, and FIG. 12(B) being a diagram of the terminals of the terminal unit in a state of having come into contact with the charging electrodes.
Figure 12B:
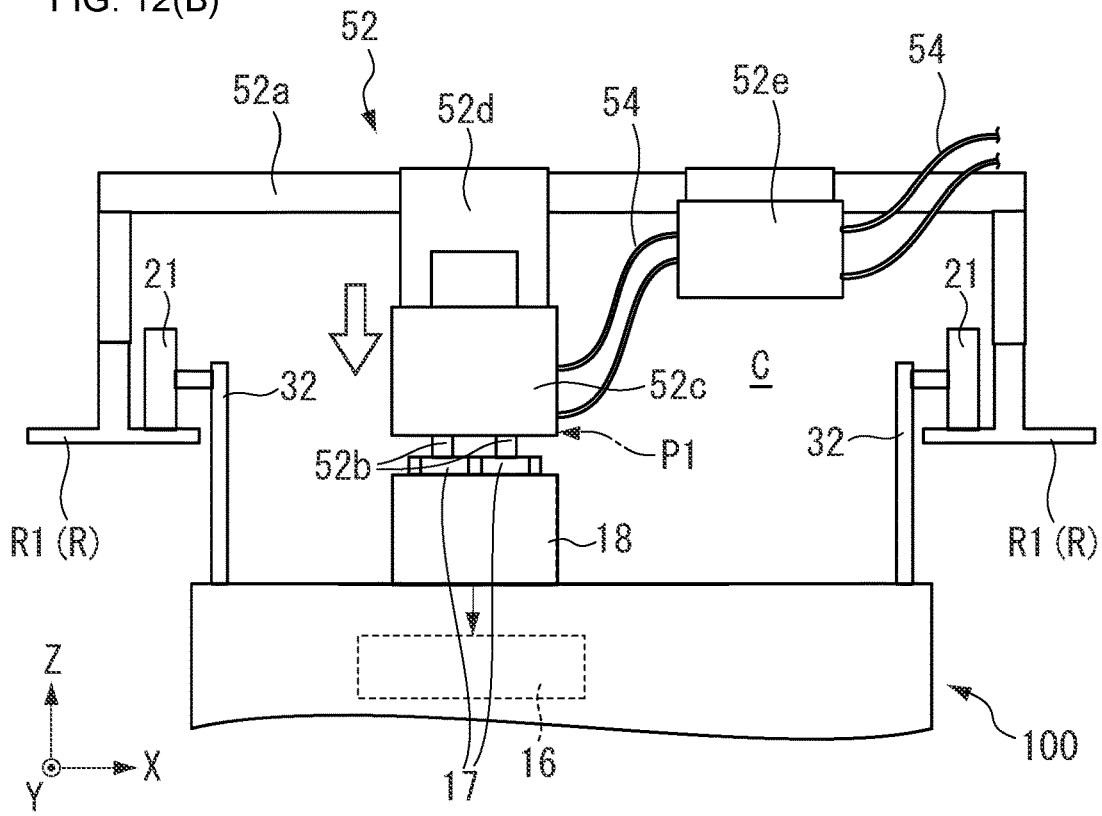

FIG. 12 shows an example of an operation performed by the terminal unit 52, FIG. 12(A) being a diagram showing a state where the terminals 52b of the terminal unit 52 are away from the charging electrodes 17, and FIG. 12(B) being a diagram showing a state where the terminals 52b of the terminal unit 52 are in contact with the charging electrodes 17. At the timing when the overhead traveling vehicle 100 reaches the cell C where the terminal unit 52 is arranged, the holder 52c of the terminal unit 52 is located at the waiting position P2 and the terminals 52b are away from and above the charging electrodes 17 as shown in FIG. 12(A).

From this state, the elevator 52d is driven to lower the holder 52c from the waiting position P2 to the connection position P1. As shown in FIG. 12(B), this operation brings the two terminals 52b into contact respectively with the two charging electrodes 17, and the terminals 52b and the charging electrodes 17 are electrically connected. As a result, electric power from the power supply unit 51 is supplied to the battery 16 via the terminals 52b and the charging electrodes 17. When charging of the battery 16 is completed, the control unit 53 receives, for example, a charging completion signal from the overhead traveling vehicle 100 via the host controller or receives the signal directly and not via the host controller, and completes the charging operation on the basis of this information. After having stopped supplying electric power, the control unit 53 drives the elevator 52d to raise the holder 52c from the connection position P1 to the waiting position P2. This operation brings the overhead traveling vehicle 100 into the state of being able to travel.

As described above, in the overhead traveling vehicle system SYS in this example, the charger 50 is arranged in a space, at least a part of which overlaps with a movement space K1 for the traveling wheels 21 as viewed in a side view, and which does not overlap with the movement space K1 for the traveling wheels 21 as viewed in a plan view. Therefore, while preventing the traveling wheels 21 from interfering with the charger 50, it is possible to suppress the space for arranging the charger 50 above the grid-patterned track R. As a result, the grid-patterned track R can be arranged in the vicinity of the ceiling, and it is therefore possible to suppress a reduction in the efficiency of space utilization in the building. Since the charger 50 is arranged in the space which does not overlap with the movement space K1 of the traveling wheels 21 as viewed in a plan view, the overhead traveling vehicle 100 traveling on the grid-patterned track R along the traveling surfaces R1a, R2a, and R3a does not cause interference with the charger 50, and the charging electrodes 17 can be positioned below the charger 50 from any direction.

An example of our systems has been described above. However, our systems are not limited to the above description, and various modifications may be made without departing from the scope of this disclosure. For example, the above example has been described, taking a configuration as an example in which the charging electrodes 17 are fixed to the upper surface 10a of the main body 10, however, our systems are not limited to this configuration. For example, a configuration may be employed in which the charging electrodes 17 are raised or lowered by an elevator. In this configuration, the charging electrodes 17 may be arranged at a portion that overlaps with the pivoting space K2 of the steerer 34 as viewed in a plan view. Also, in this configuration, the charging electrodes 17 and the terminals 52b may be brought into contact with each other by fixing the holder 52c of the terminal unit 52 and raising the charging electrodes 17.

The above example has been described, taking a configuration of the grid-patterned track R as an example of the track in which a plurality of the first tracks R1 and a plurality of the second tracks R2 orthogonally intersect with each other, and a plurality of cells C are adjacent to each other as viewed in a plan view. However, our systems are not limited to this configuration. The track may be in the form of extending in one direction and having no intersections.

The above example has been described, taking a configuration as an example in which the charger 50 is arranged in a cell C, which is an intersection where the first tracks R1 and the second tracks R2 intersect with each other. However, our systems are not limited to this configuration. The charger 50 may be arranged at a location other than an intersection of the first tracks R1 and the second tracks R2.

The above example has been described, taking an example where charging is performed by bringing the terminals 52b of the terminal unit 52 into contact with the charging electrodes 17 of the overhead traveling vehicle 100. However, our systems are not limited to this configuration. For example, there may be applied a form in which electric power is supplied in a non-contact state where the terminals 52b and the charging electrodes 17 are away from each other (so-called non-contact power supply). Furthermore, the contents of Japanese Patent Application No. 2018-150670 and all documents cited in the detailed description are incorporated herein by reference.

The invention claimed is:

1. An overhead traveling vehicle system having an overhead traveling vehicle comprising:
   a main body, at least an upper surface of which is of a rectangular shape as viewed in a plan view, and a traveling wheel provided in each of four corners on the upper surface of the main body and rolls on a traveling surface of a track, the main body being arranged below the track by connectors each extending downwardly from the traveling wheel,
   wherein the overhead traveling vehicle includes charging electrodes on the upper surface of the main body, and
   a charger is arranged in a space above the traveling surface, at least a part of which overlaps with a movement space for the traveling wheels as viewed in a side view, and does not overlap with the movement space as viewed in a plan view.

2. The overhead traveling vehicle system according to claim 1,
   wherein the track includes a first track provided along a first direction and a second track provided along a second direction intersecting with the first direction,
   the overhead traveling vehicle can travel, moving from the first track to the second track, or from the second track to the first track, and
   the charger is arranged at an intersection between the first track and the second track.

3. The overhead traveling vehicle system according to claim 2,
   wherein the track is a grid-patterned track in which a plurality of the first tracks and a plurality of the second tracks orthogonally intersect with each other and a plurality of cells are adjacent to each other as viewed in a plan view,
   the charger includes at least a power supply unit and a terminal unit, and
   the power supply unit and the terminal unit are each arranged in a manner of being distributed to adjacent cells.

4. The overhead traveling vehicle system according to claim 3, wherein the first tracks and the second tracks are both provided along the same or substantially the same horizontal plane.

5. The overhead traveling vehicle system according to claim 3, wherein the terminal unit can be raised or lowered between a connection position to be in contact with the charging electrodes and a waiting position to be away from the charging electrodes.

6. The overhead traveling vehicle system according to claim 3,
- wherein the charger includes a control unit which controls the power supply unit and the terminal unit, and
- the control unit is arranged in a cell different from the cells in which the power supply unit and the terminal unit are arranged.

7. The overhead traveling vehicle system according to claim 6,
- wherein the power supply unit, the terminal unit, and the control unit are electrically connected to each other by wiring, and
- the wiring is arranged above the movement space.

8. The overhead traveling vehicle system according to claim 2,
- wherein the overhead traveling vehicle includes a steerer that causes the traveling wheel to pivot around an axis in the vertical direction, and
- the charger is arranged in a space that does not overlap with a pivoting space of the traveling wheel as viewed in a plan view.

9. The overhead traveling vehicle system according to claim 8, wherein the charging electrodes are arranged in a portion that does not overlap with a pivoting space of the steerer as viewed in a plan view.

* * * * *